United States Patent
Khrustalev et al.

(10) Patent No.: US 6,536,510 B2
(45) Date of Patent: Mar. 25, 2003

(54) THERMAL BUS FOR CABINETS HOUSING HIGH POWER ELECTRONICS EQUIPMENT

(75) Inventors: Dmitry Khrustalev, Lancaster, PA (US); Jon Zuo, Lancaster, PA (US)

(73) Assignee: Thermal Corp., Stanton, DE (US)

( * ) Notice: Subject to any disclaimer, the term of this patent is extended or adjusted under 35 U.S.C. 154(b) by 97 days.

(21) Appl. No.: 09/902,088

(22) Filed: Jul. 10, 2001

(65) Prior Publication Data

US 2003/0010477 A1 Jan. 16, 2003

(51) Int. Cl.[7] ............................................. F28D 15/00
(52) U.S. Cl. ........................ 165/104.33; 165/104.26; 165/80.4; 361/724; 361/700; 257/715; 174/15.2
(58) Field of Search ...................... 165/80.4, 104.26, 165/104, 33, 185; 361/699, 700, 724; 174/15.1, 15.2; 257/715, 716

(56) References Cited

U.S. PATENT DOCUMENTS

| | | | |
|---|---|---|---|
| 3,317,798 A | 5/1967 | Chu et al. .................... 317/100 |
| 3,387,648 A | 6/1968 | Ward, Jr. et al. | |
| 4,323,914 A | 4/1982 | Berndlmaier et al. ......... 357/82 |
| 4,366,526 A | 12/1982 | Lijoi et al. .................. 361/385 |
| 4,449,576 A | * 5/1984 | Baum et al. ............ 165/104.33 |
| 4,602,679 A | 7/1986 | Edelstein et al. ....... 165/104.26 |
| 4,612,978 A | * 9/1986 | Cutchaw ................ 165/104.33 |
| 4,793,405 A | 12/1988 | Diggelmann et al. .. 165/104.33 |
| 4,903,761 A | * 2/1990 | Cima ..................... 165/104.26 |
| 4,931,905 A | 6/1990 | Cirrito et al. ................ 361/385 |
| 4,941,530 A | 7/1990 | Crowe ................... 165/104.33 |
| 4,949,164 A | 8/1990 | Ohashi et al. ................. 357/82 |
| 5,003,376 A | 3/1991 | Iversen ......................... 357/82 |
| 5,057,968 A | * 10/1991 | Morrison .................... 361/724 |
| 5,063,475 A | 11/1991 | Balan ......................... 361/384 |
| 5,077,601 A | 12/1991 | Hatada et al. ................. 357/81 |
| 5,150,278 A | 9/1992 | Lynes et al. ................ 361/386 |
| 5,201,364 A | 4/1993 | Tippmann et al. | |
| 5,203,399 A | 4/1993 | Koizumi ................. 165/104.33 |
| 5,283,715 A | 2/1994 | Carlsten et al. ............. 361/702 |
| 5,329,425 A | 7/1994 | Leyssens et al. ........... 361/701 |

(List continued on next page.)

FOREIGN PATENT DOCUMENTS

| | | |
|---|---|---|
| JP | 9-69595 | 3/1997 |
| SU | 788461 | 12/1980 |

OTHER PUBLICATIONS

Chrysler et al., "Enhanced Thermosyphon Cooling System," IBM Technical Disclosure Bulletin, vol. 37, No. 10, Oct., 1994, pp. 11–12.

*Primary Examiner*—Henry Bennett
*Assistant Examiner*—Terrell McKinnon
(74) *Attorney, Agent, or Firm*—Duane Morris LLP

(57) ABSTRACT

A thermal bus is provided for cabinets housing high power electronics equipment that includes two spaced-apart horizontally oriented parallel evaporators interconnected in flow communication with a condenser. Each evaporator is mounted in a support having a central recess and each having a tube having a capillary wick disposed on an internal surface and being mounted within the central recess of the support. Each of the tubes includes a closed distal end and a closed proximal end with a liquid-working fluid entrance port located at the closed proximal end of the first tube and a vaporous-working fluid exit port located at the closed proximal end of the second tube. A duct defining a central passageway and having a capillary wick disposed on the walls of the central passageway is disposed in fluid communication with the first tube and the second tube. The condenser has a vaporous-working fluid entrance port disposed in flow communication with the vaporous-working fluid exit port of the evaporator and a liquid-working fluid exit port disposed in flow communication with the liquid-working fluid entrance port of the evaporator so that a working fluid cycles; (i) through the two spaced-apart parallel evaporators, and (ii) between the condenser and the two tubes.

36 Claims, 14 Drawing Sheets

U.S. PATENT DOCUMENTS

| | | | |
|---|---|---|---|
| 5,361,188 A | | 11/1994 | Kondou et al. ............. 361/695 |
| 5,394,936 A | * | 3/1995 | Budelman .............. 165/104.33 |
| 5,404,272 A | * | 4/1995 | Lebailly et al. ............. 361/700 |
| 5,424,916 A | * | 6/1995 | Martin ...................... 361/699 |
| 5,513,071 A | | 4/1996 | LaViolette et al. ......... 361/703 |
| 5,574,627 A | * | 11/1996 | Porter ........................ 361/699 |
| 5,587,880 A | | 12/1996 | Phillips et al. .............. 361/687 |
| 5,613,552 A | | 3/1997 | Osakabe et al. ....... 165/104.21 |
| 5,713,413 A | | 2/1998 | Osakabe et al. ....... 165/104.33 |
| 5,720,338 A | | 2/1998 | Larson et al. .................. 165/46 |
| 5,725,049 A | * | 3/1998 | Swanson et al. ....... 165/104.26 |
| 5,832,989 A | | 11/1998 | Osakabe et al. ....... 165/104.33 |
| 5,836,381 A | | 11/1998 | Osakabe et al. ....... 165/104.21 |
| 5,953,930 A | | 9/1999 | Chu et al. .................. 62/259.2 |
| 6,055,157 A | | 4/2000 | Bartilson .................... 361/699 |
| 6,076,595 A | | 6/2000 | Austin et al. |
| 6,223,810 B1 | | 5/2001 | Chu et al. .............. 165/104.33 |
| 6,360,813 B1 | * | 3/2002 | Katoh et al. ........... 165/104.33 |

* cited by examiner

THERMAL BUS FOR CABINETS HOUSING HIGH POWER ELECTRONICS EQUIPMENT

FIELD OF THE INVENTION

The present invention generally relates to heat management systems for high power electronics equipment, and more particularly to a thermal bus system for a cabinet housing high power, high thermal profile electronic components and systems.

BACKGROUND OF THE INVENTION

In many electronic systems, the efficient cooling of electronic components has become a significant problem. With the advent of large-scale integrated circuit (IC) modules containing many thousands of circuit elements, it has become possible to pack great numbers of electronic components together within a very small volume. As is well known, these integrated circuit modules generate significant amounts of heat during the course of their normal operation. Since most solid state devices are sensitive to excessive temperatures, a solution to the problem of the generation of heat by large scale IC's in close proximity to one another has become of increasing concern to industry.

A typical prior art approach to cooling electronic components is to direct a stream of cooling air across the modules and/or cards carrying such devices. Several disadvantages to this approach have been identified, including: high pressure drop; uniformity of component form factors; placing the components containing the integrated circuits further apart on the circuit cards; increasing the distance between circuit cards; and increasing the volume and velocity of cooling air directed over the components. This required increase in volume and velocity of cooling air requires special considerations in the design of the housings containing the circuit cards and in the mechanical systems for delivering the cooling air. Also, the air quality(moisture content, contamination, etc.) must be tightly controlled to inhibit corrosion, loss of cooling effectiveness, etc. Thus, cooling of components by this means necessitates a number of compromises to the overall system that prevent its use in many systems.

Increases in the sophistication of electronic systems has brought about denser packaging of electronic components with attendant increases in power density and total card power. This has brought about the evolution of other techniques for cooling card-mounted electronic components. For example, one technique includes the use of solid metal thermal mounting cards or plates which conduct the heat dissipated by electronic components to a heat sink (cold plate) disposed at the edge of each card. Such an approach, however, results in a large thermal resistance from the component mounting surface to the heat sink, which causes high component temperatures.

In another known technique for cooling electronic systems, a two-phase loop thermosyphon is used to bus thermal energy away from the electronic components. More particularly, two-phase loop thermosyphons are devices that use gravity to maintain two-phase fluid circulation during operation. Each loop thermosyphon has an evaporator, where vaporization occurs when it is heated, a vapor tube (or line) where the vapor flows to a condenser, a cooled condenser, where condensation takes place, and a liquid return line (transport lines). Sometimes a capillary structure is used in the evaporator to reduce its thermal resistance. Significantly, prior art thermosyphon evaporators must have a vertical orientation so that the entire evaporator and capillary structure are flooded with liquid, which in turn boils when the evaporator is heated. This means that there is a liquid pool in the evaporator, and it is the boiling of that pool that is the main heat transfer mechanism in thermosyphon evaporators. Unfortunately, pool boiling heat transfer has been found to be less effective than vaporization from the surface of a porous structure, in terms of the thermal resistance.

Various other techniques for cooling electronics equipment in a cabinet are disclosed in the prior art, for example, U.S. Pat. No. 4,323,914, issued to Berndlmaier et al., discloses the removal of heat from a Large Scale Integrated Circuit semiconductor package via a thermal conductive path including a thermally conductive liquid. The integrated circuit chips are flip chips bonded to a substrate having a printed circuit and raised contact pads serving to interconnect contact areas on the chip. A metal or ceramic cover engages the perimeter of the substrate and encloses the chips (or chip). The thermal liquid is contained within the cavity defined by the cover and substrate. The chips (or chip) and the flip chip connections are protected from contamination and the deleterious effects of the thermally conductive liquid by a parylene film enveloping them.

U.S. Pat. No. 4,366,526, issued to Lijol et al., discloses a circuit card for high-density packaging of electronic components for use in high power-density card racks in computer and other electronic and avionic systems. The card has an all metal construction with an elongated planar body portion for the mounting of electronic components on opposite sides, and has a heat pipe located along the edges of one elongated side and two ends. A connector for making the required electrical connections to the electronic components is provided along the edge of elongated side. Edge tabs on the ends of the card permit the card to be installed into a card rack in electronic equipment. The elongated portion of the heat pipe serves as the evaporator region and the two end portions act as the condensing regions.

U.S. Pat. No. 4,931,905, issued to Cirrito et al., discloses two metal plates that have U-shaped grooves so that the plates may form congruent halves wherein matching grooves complete independent heat pipes. A bight section of each heat pipe serves as an evaporator section while the parallel arms of each heat pipe form condenser sections. A wick is positioned within each heat pipe to improve liquid transport when a module is in a non-upright position. The condenser sections are located coincident with the normally upright edges of each module so that, when the module is upright, the vertically disposed condenser sections of the heat pipe gravity-assist liquid transport to the evaporator section.

U.S. Pat. No. 5,283,715, issued to Carlsten et al., discloses a heat pipe structure that is incorporated directly into the metal baseplate of a circuit card thereby eliminating thermal contact resistance between the baseplate and the heat pipe assembly. Components are mounted on a copper circuit layer bonded to a dielectric layer in a first portion of the baseplate with a second portion of the baseplate/heat pipe assembly extending into a heat sink/cold plate condensing area for removal of heat generated in the component portion.

U.S. Pat. No. 6,055,157, issued to Bartilson, discloses a computer module for scalably adding computing power and cooling capacity to a computer system. The computing module includes a first heat pipe assembly having an evaporator plate with an evaporator surface. The first heat pipe also has a condenser in fluid communication with the evaporator plate. The evaporator plate is positioned adjacent one side of a printed circuit board populated with at least one electronic component, or a printed circuit board which has two sides populated with electronic components. When a printed circuit board having components on two sides is used, a second heat pipe having the same construction is positioned adjacent the other side of the printed circuit board so that the electronic components on the other side are positioned adjacent the evaporator surface of the second heat pipe. The evaporator plate of each heat pipe is connected to the condenser by a plurality of necked-down regions. This forms at least one window between the condenser and the evaporator plate of each heat pipe. When more than one heat pipe is used in the computing module, the windows of the various heat pipes align. Electrical connector components can be routed through the windows. The connector component connects the edge of the printed circuit board positioned near the windows.

SUMMARY OF THE INVENTION

The present invention provides a thermal bus for cabinets housing high power electronics equipment. In one embodiment, two spaced-apart substantially horizontally oriented evaporators are provided where each is substantially horizontally mounted in a support and positioned in thermal communication with at least one heat generating device. Each of the two elongate evaporators defines a central passageway having a liquid-working fluid entrance port and a vaporous-working fluid exit port and a capillary wick disposed on the walls of the central passageway. A duct defining a central passageway and having a capillary wick disposed on the walls of the central passageway is disposed in fluid communication with the central passageways of the two spaced-apart evaporators A condenser is provided having a vaporous-working fluid entrance port disposed in flow communication with the vaporous-working fluid exit port and a liquid-working fluid exit port disposed in flow communication with the liquid-working fluid entrance port so that a working fluid cycles through the two spaced-apart evaporators, and between the condenser and the two spaced-apart evaporators.

In another embodiment of the invention, a thermal bus is provided for cabinets housing high power electronics equipment that includes two substantially horizontally oriented parallel evaporators interconnected in flow communication with a condenser. Each evaporator is substantially horizontally mounted in a support having a central recess and each having a tube having a capillary wick disposed on an internal surface and being mounted within the central recess of the support. Each of the tubes includes a closed distal end and a closed proximal end with a liquid-working fluid entrance port located at the closed proximal end of the first tube and a vaporous-working fluid exit port located at the closed proximal end of the second tube. A duct defining a central passageway and having a capillary wick disposed on the walls of the central passageway is disposed in fluid communication with the first tube and the second tube. The condenser has a vaporous-working fluid entrance port disposed in flow communication with the vaporous-working fluid exit port of the evaporator and a liquid-working fluid exit port disposed in flow communication with the liquid-working fluid entrance port of the evaporator so that a working fluid cycles; (i) through the two spaced-apart parallel evaporators, and (ii) between the condenser and the two tubes.

In a further embodiment, a system for controlling the heat generated within a cabinet housing high power electronics equipment is provided comprising, in combination, a plurality of circuit boards having heat generating devices disposed on at least one surface and a plurality of substantially horizontally oriented thermal buses. Each thermal bus comprises two spaced-apart evaporators that are each substantially horizontally mounted in a support and positioned in thermal communication with at least one of the plurality of circuit boards. Each of the two elongate evaporators defines a central passageway having a liquid-working fluid entrance port and a vaporous-working fluid exit port and a capillary wick disposed on the walls of the central passageway. A duct defining a central passageway and having a capillary wick disposed on the walls of the central passageway is disposed in fluid communication with the central passageways of the two spaced-apart evaporators. A condenser is provided having a vaporous-working fluid entrance port disposed in flow communication with the vaporous-working fluid exit port and a liquid-working fluid exit port disposed in flow communication with the liquid-working fluid entrance port so that a working fluid cycles; (i) through the two spaced-apart evaporators, and (ii) between the condenser and the two spaced-apart evaporators. A rack is positioned within the cabinet so as to support the plurality of thermal busses and circuit boards in a substantially horizontal relation to the rack.

BRIEF DESCRIPTION OF THE DRAWINGS

These and other features and advantages of the present invention will be more fully disclosed in, or rendered obvious by, the following detailed description of the preferred embodiment of the invention, which is to be considered together with the accompanying drawings wherein like numbers refer to like parts and further wherein.

DETAILED DESCRIPTION OF THE PREFERRED EMBODIMENT

Figure 1:
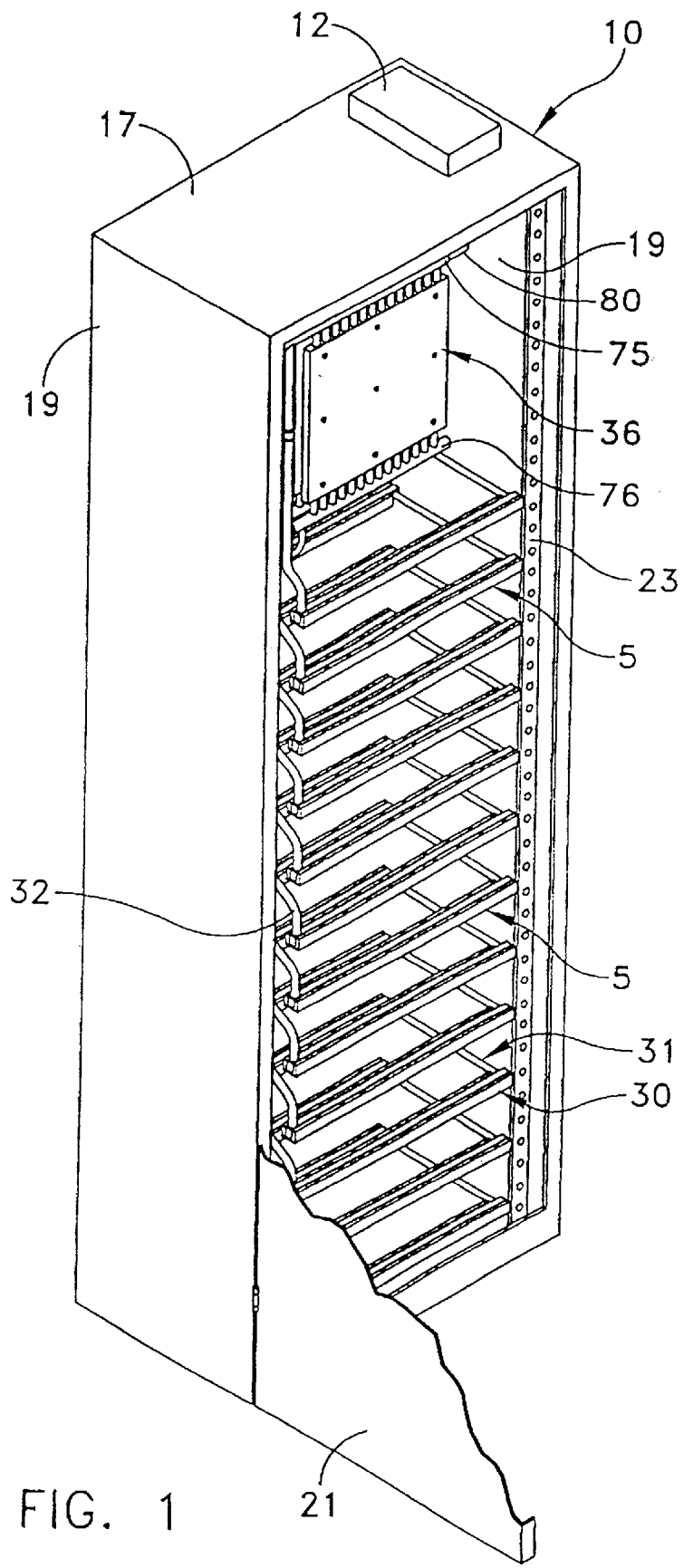
FIG. 1 is a perspective view of a cabinet for housing high power electronics equipment, including a plurality of thermal buses formed in accordance with the present invention.

This description of preferred embodiments is intended to be read in connection with the accompanying drawings, which are to be considered part of the entire written description of this invention. In the description, relative terms such as "horizontal," "vertical," "up," "down," "top" and "bottom" as well as derivatives thereof (e.g., "horizontally," "downwardly," "upwardly," etc.) should be construed to refer to the orientation as then described or as shown in the drawing figure under discussion. Terms including "inwardly" versus "outwardly," "longitudinal" versus "lateral" and the like are to be interpreted relative to one another or relative to an axis of elongation, or an axis or center of rotation, as appropriate. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. The term "operatively connected" is such an attachment, coupling or connection that allows the pertinent structures to operate as intended by virtue of that relationship.

Figure 2:
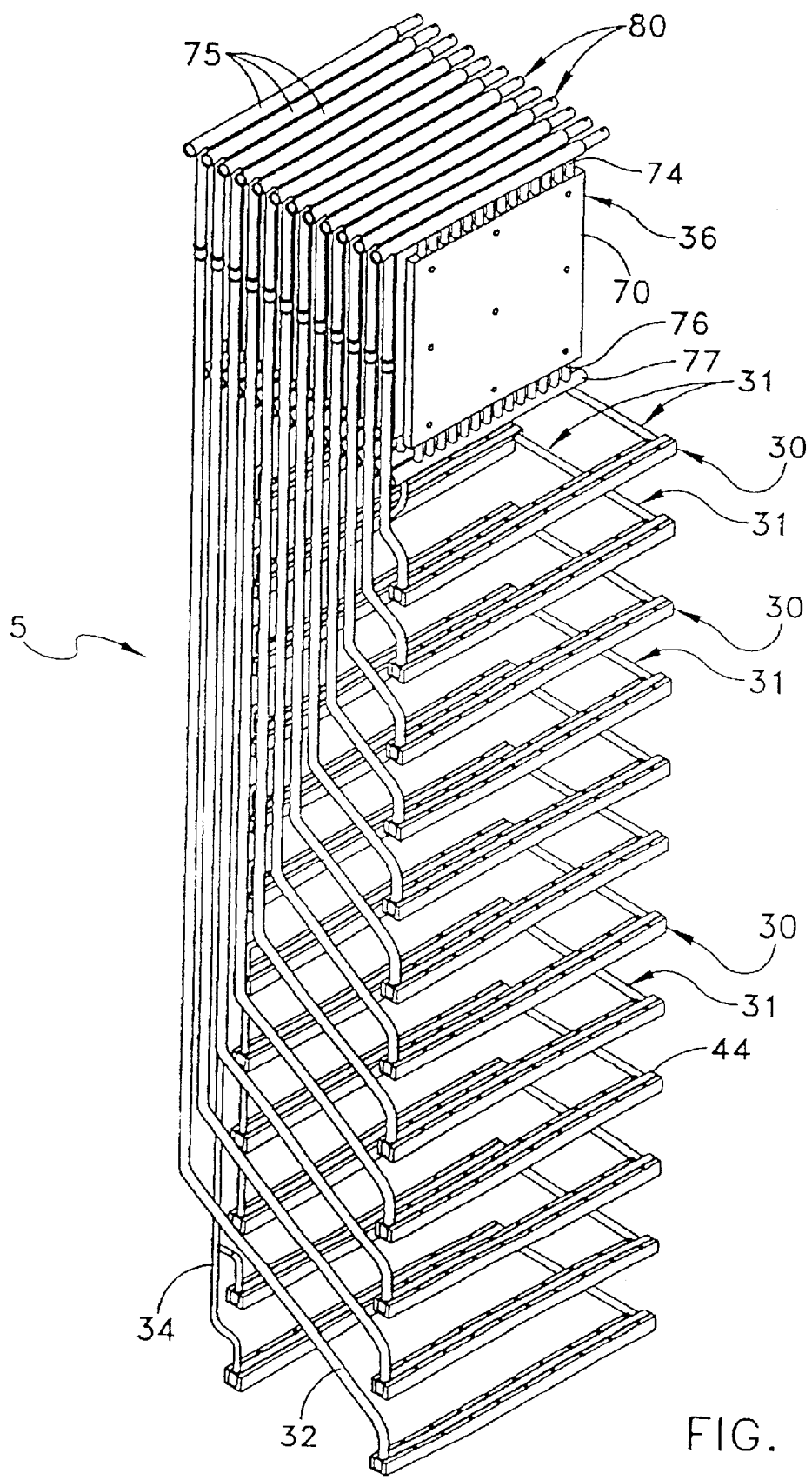
FIG. 2 is a perspective view of the plurality of thermal buses shown in FIG. 1, with the cabinet removed for clarity of illustration.

Referring to FIGS. 1 and 2, the present invention provides a plurality of passive, two phase thermal buses 5 that are integrated within an electronics cabinet 10. Each thermal bus 5 operates to collect thermal energy from individual electronic components 7, or from circuit boards 9 (FIG. 3) that support a plurality of such electronic components 7, and to transport the collected thermal energy to an external sink 12. Electronics cabinet 10 comprises a generally rectilinear hollow structure having a top wall 17 that is vertically spaced from a bottom wall 18, and side walls 19 that are joined along coextensive edges, with surfaces that are horizontally spaced from one another. Electronics cabinet 10 also includes an access panel 21 and a rack 23 positioned within the enclosure formed by top wall 17, side walls 19, and access panel 21.

Figure 3:
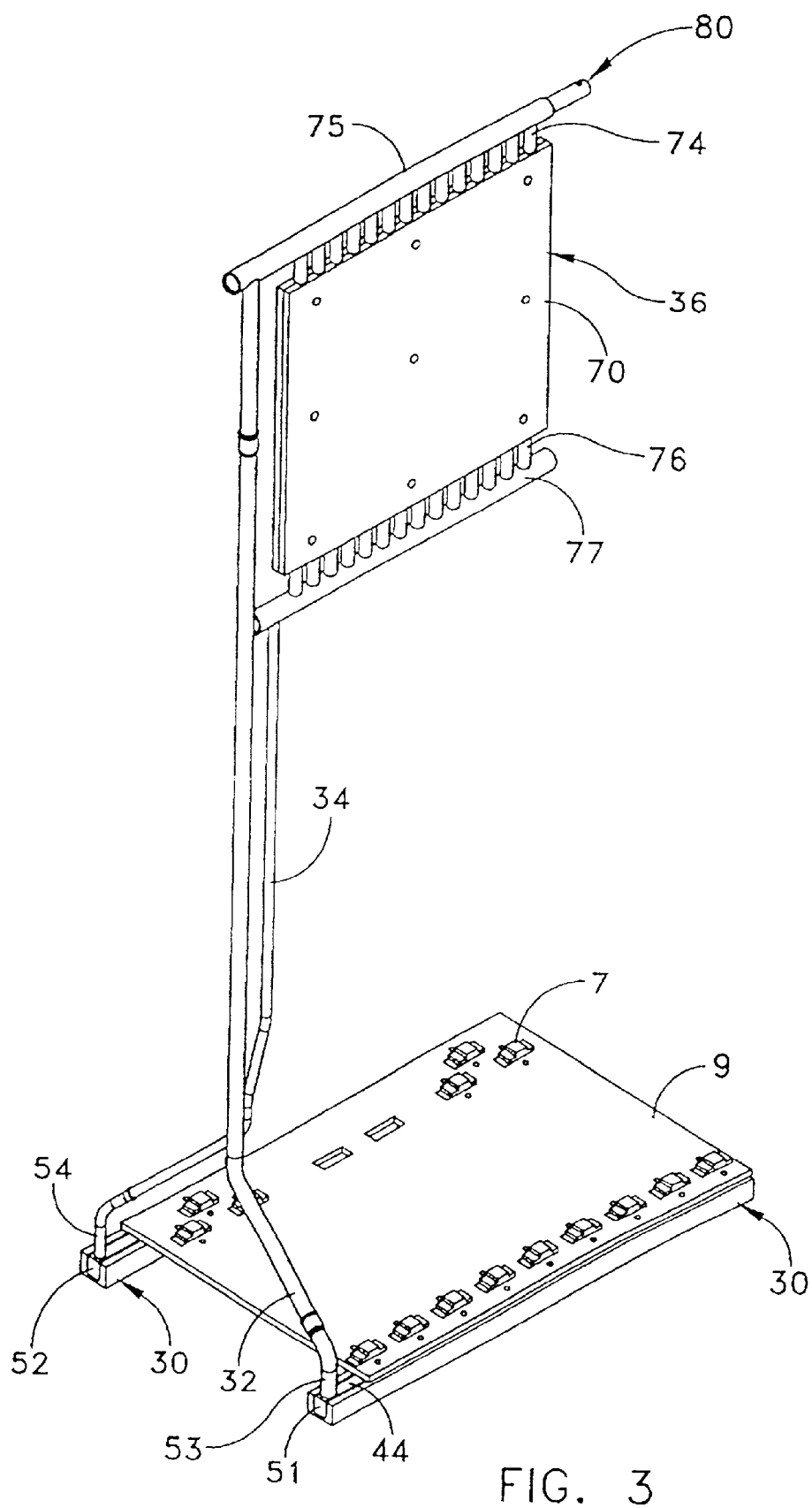
FIG. 3 is a perspective view of an individual thermal bus having a circuit board positioned on a pair of rail-evaporators.
Figure 4:
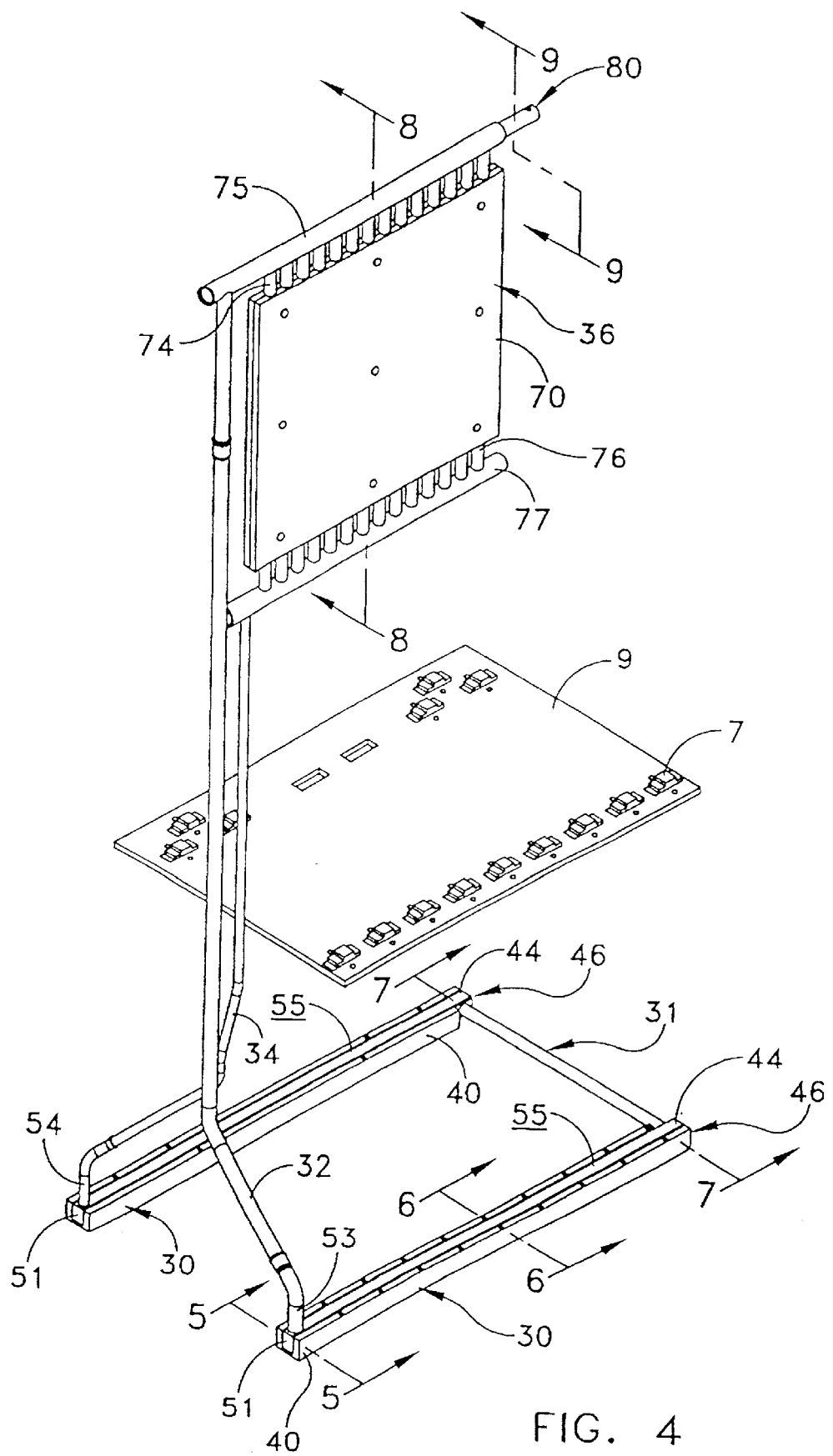
FIG. 4 is a is a perspective of the thermal bus shown in FIG. 3, with the circuit board suspended above the rail-evaporator for clarity of illustration.
Figure 5:
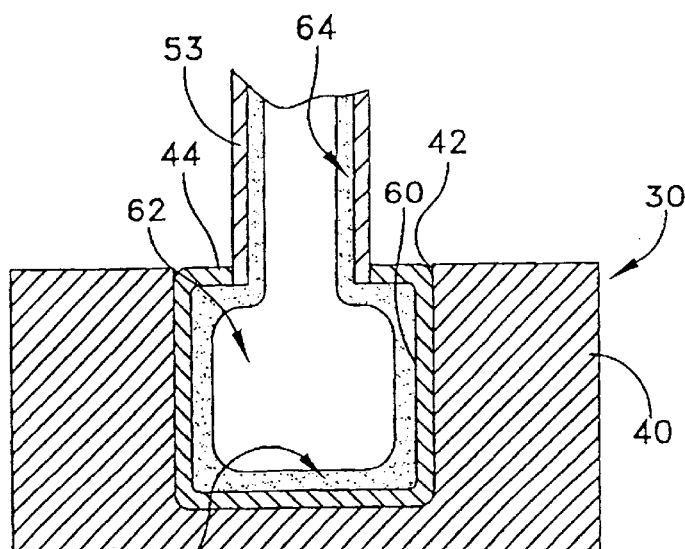
FIG. 5 is a cross-sectional view of a proximal portion of a rail-evaporator, as taken along lines 5—5 in FIG. 4.
Figure 6:
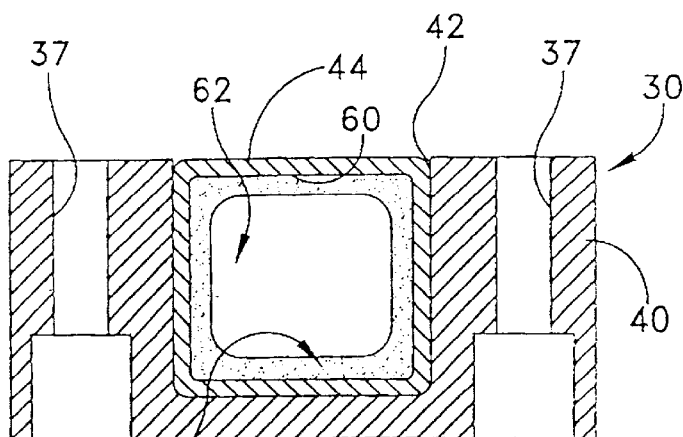
FIG. 6 is a cross-sectional view of a central portion of an rail-evaporator, as taken along lines 6—6 in FIG. 4.

Referring to FIGS. 3–7, one embodiment of the invention provides a thermal bus 5 that may be used to transport the heat generated by components that are arranged in discrete rows on a horizontally oriented circuit board 9. The arrangement of electronic components in discrete rows on a circuit board is quite common in applications which use, for example, a small number of high power amplifiers. The heat flux in such applications can often exceed 25 watts/cm$^2$. Referring to FIG. 4, each circuit board 9 in electronics cabinet 10 is fastened to a thermal bus 5 comprising a pair of substantially horizontally oriented rail-evaporators 30, an inter-rail duct 31, a vapor conduit 32, a liquid conduit 34, and a plate condenser 36. Thus, electronics cabinet 10 may include a plurality of pairs of horizontally oriented rail-evaporators 30 so as to manage the thermal energy generation from a plurality of horizontally oriented circuit boards 9 that are stacked one-above-another on rack 23 (FIG. 1). When supported by rail-evaporators 30, circuit boards 9 extend transversely between sidewalls 19. Rail-evaporators 30 may be tilted relative to a horizontal plane passing through sidewalls 19, by as much as ten degrees or so.

Figure 7:
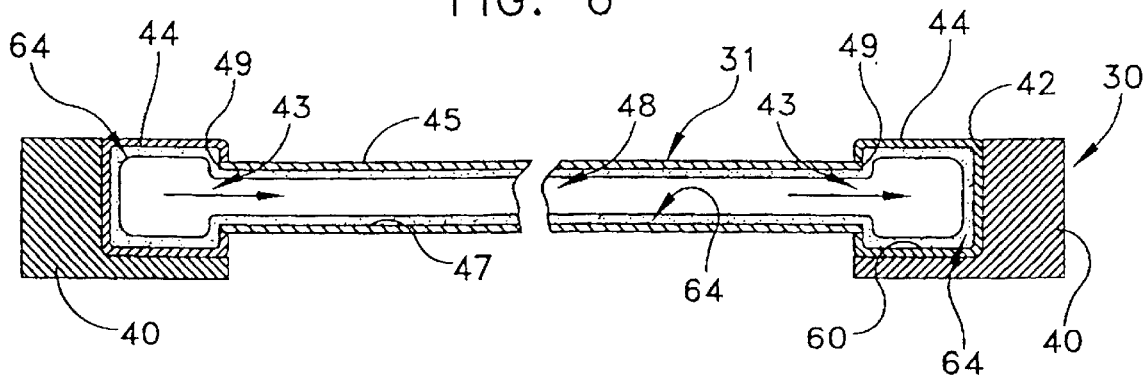
FIG. 7 is a cross-sectional view of the distal portion of the rail evaporator and an inter-rail duct, as taken along lines 7—7 in FIG. 4.

More particularly, rail evaporators 30 are arranged in spaced apart, substantially parallel relation to one another, with each rail evaporator 30 including a rail 40 having a milled channel 42 (FIGS. 5 and 6) that extends along its length, and a rectilinear tube 44 mounted within channel 42. Rail evaporators 30 may be formed from any of the well known metals utilized for heat transfer applications, e.g., copper or its alloys, aluminum or its alloys, steels, etc. Each channel 42 is open ended, and includes an inner opening 43 that is sized to receive inter-rail duct 31 (FIG. 7). A plurality of through-bores 37 are located along both sides of channel 42 for receiving fasteners, such as bolts, screws, etc., which fasten circuit board 9 to each rail-evaporator 30. Inter-rail duct 31 preferably comprises a hollow cylindrical cross-section tube 45 having open ends and an interior surface 47 that forms a central passageway 48. Each tube 44 comprises a closed distal end 46, a side bore 49, a closed proximal end 51, a port 53,54 located on a top portion of proximal end 51, and an exposed thermal interface surface 55 (FIG. 4). Each side bore 49 is located adjacent to closed distal end 46, and is arranged in aligned relation with opening 43 of channel 42. Bores 49 and openings 43 are sized and shaped to sealingly receive a respective open end of inter-rail duct 31.

Each tube 44 preferably comprises a rectilinear cross-section, which when mounted within channel 42, provides for more surface area for heat exchange and conductive contact between thermal interface surface 55 and the bottom surface of circuit board 9. Tubes 44 are preferably formed from a soft, highly thermally conductive metal, such as, copper or aluminum. An interior surface 60 of each tube 44 defines a central passageway 62 and supports a capillary wick 64. Capillary wick 64 extends throughout interior surface 60 of both tubes 44, ports 53,54, and the interior surface of inter-rail duct 31. Capillary wick 64 may comprise adjacent layers of screening or a sintered powder structure with interstices between the particles of powder. In one embodiment, wick 64 may comprise sintered copper powder, aluminum-silicon-carbide (AlSiC) or copper-silicon-carbide (CuSiC) having an average thickness of about 0.1 mm to 1.0 mm.

A working fluid (not shown) is introduced into tube 44 so as to form a heat pipe that comprises both tubes 44 and inter-rail-duct 31 for each thermal bus 5. The working fluid may comprise any of the well known two-phase vaporizable liquids, e.g., water, alcohol, freon, etc. The working fluid flows along each horizontally arranged (or tilted) rail-evaporator 30 mainly due to the frictional vapor-liquid interaction on the liquid free surface of central passageway 62. Vaporization of the working fluid occurs mainly in the porous structure of wick 64, which is not typically flooded with working fluid during operation. This ensures very low thermal resistance of rail-evaporators 30 compared to a conventional, vertically oriented, thermosyphon evaporator.

Referring to FIGS. 2–4, vapor conduit 32 and liquid conduit 34 comprise open-ended tubes that extend along an outer portion of rack 23 between each pair of rail-evaporators 30 and an individual condenser 36. One open end of vapor conduit 32 is mounted in flow communication with port 53 located on the top portion of proximal end 51 of one rail-evaporator 30. The other open end of vapor conduit 32 is mounted in flow communication with a first manifold that is interconnected with a top portion of plate condenser 36. One open end of liquid conduit 34 is mounted in flow communication with port 54 located on the top portion of proximal end 51 of the other rail-evaporator 30 in the pair. The other open end of liquid conduit 34 is mounted in flow communication with a second manifold that is interconnected with a bottom portion of plate condenser 36. Vapor conduit 32 and liquid conduit 34 are preferably formed from metal tubing, with vapor conduit 32 preferably having a relatively larger diameter than liquid conduit 34.

Figure 11:
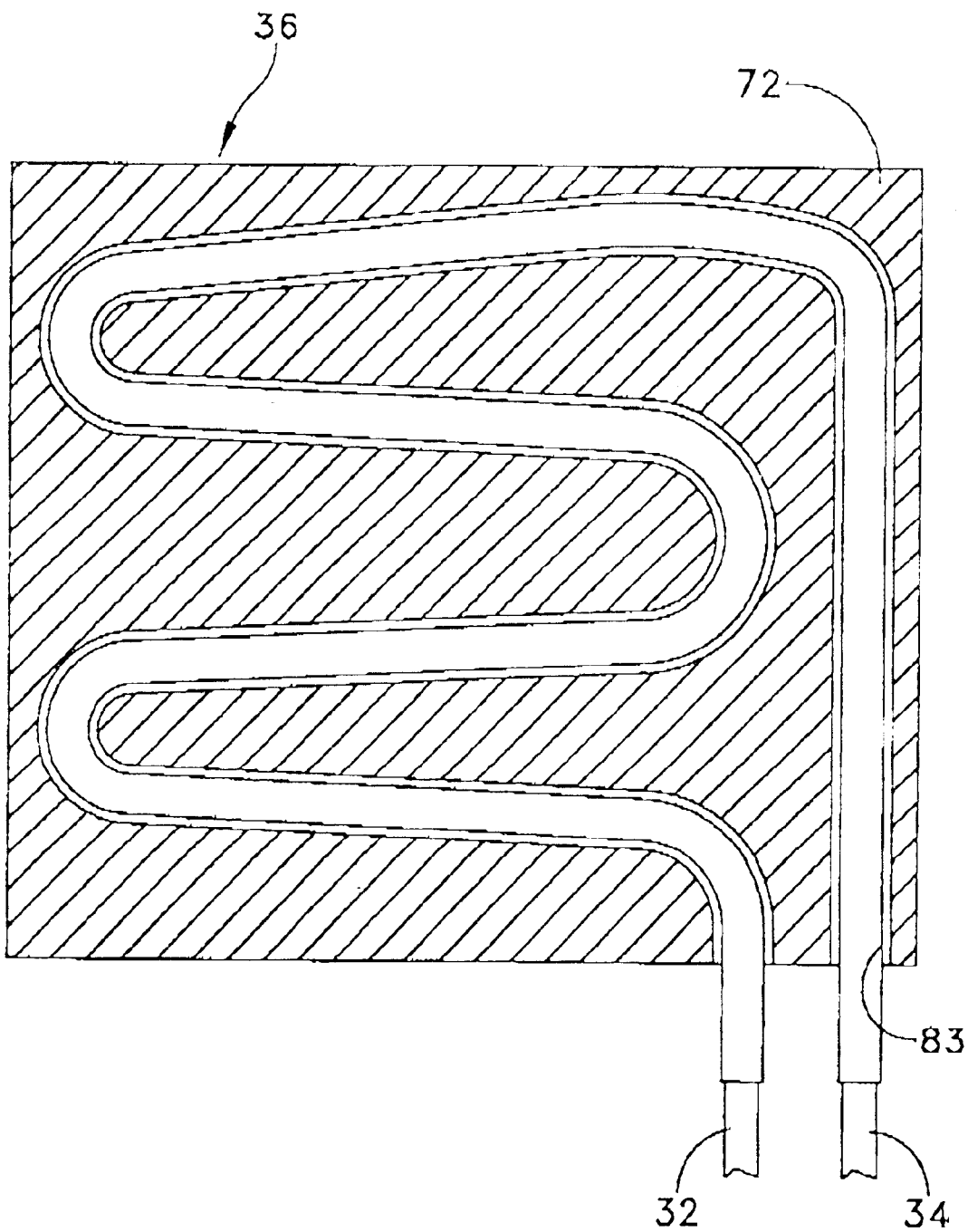
FIG. 11 is a cross-sectional side view of an alternative condenser formed in accordance with the present invention.
Figure 12:
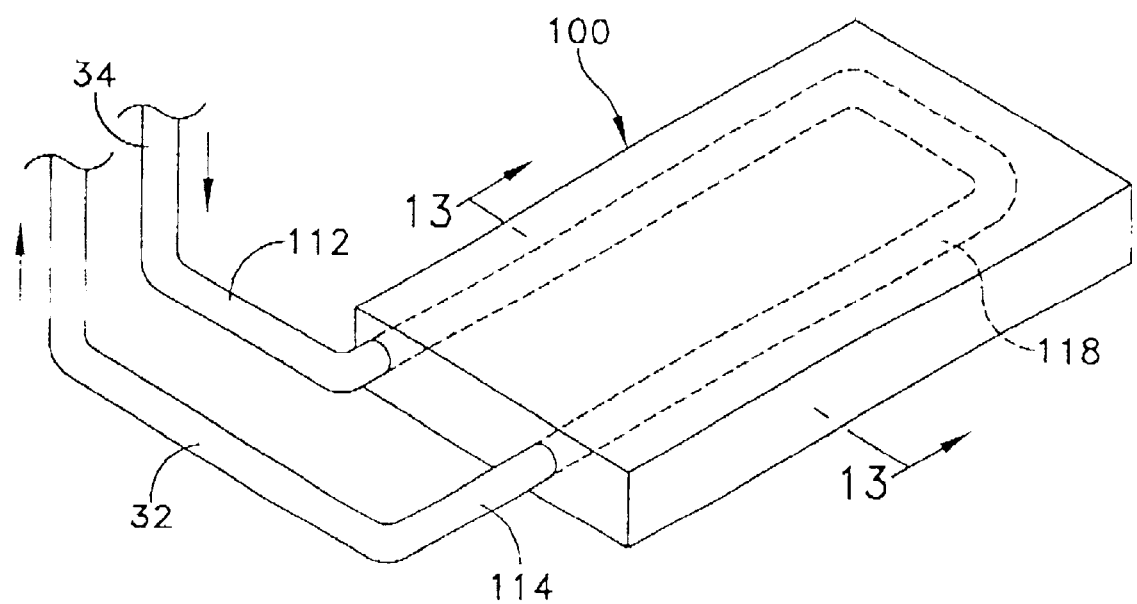
FIG. 12 is a perspective view of one embodiment of evaporator comprising a vapor chamber and working-fluid transport tube.
Figure 13:
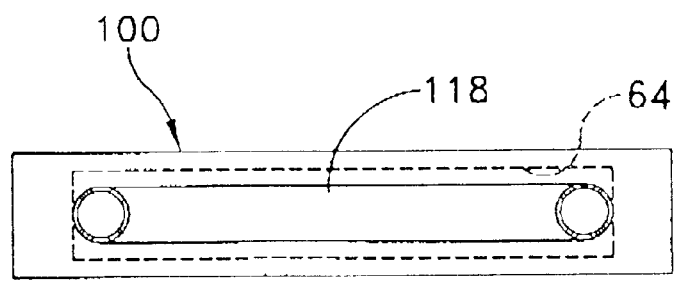
FIG. 13 is a cross-sectional view, as taken along line 13—13, of the evaporator shown in FIG. 12.
Figure 14:
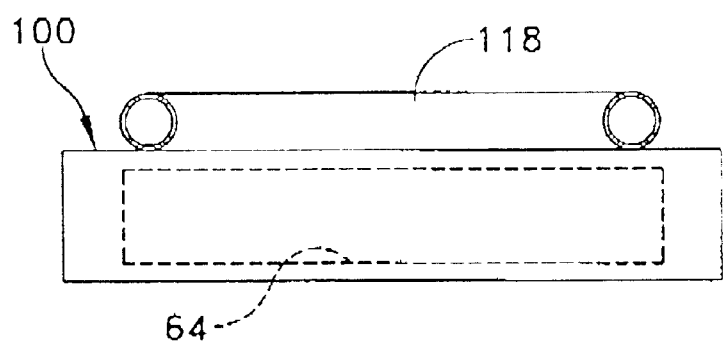
FIG. 14 is a cross-sectional view of an alternative arrangement of a working-fluid transport tube mounted to an evaporator.
Figure 15:
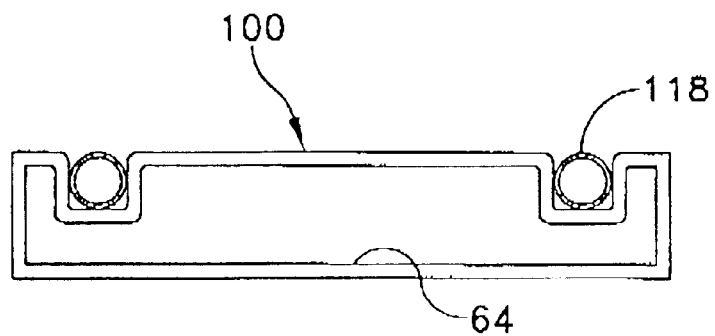
FIG. 15 is a cross-sectional view of another alternative arrangement of a working-fluid transport tube mounted to an evaporator.

Referring to FIGS. 1–4 and 8–9, plate condenser 36 is formed from a conduct metal, such as copper, aluminum, or steel and comprises a front wall 70, a rear wall 72, a plurality of inlets ducts 74 extending from an inlet manifold 75, a plurality of outlet ducts 76 extending into an outlet manifold 77, and an end cap assembly 80. Each condenser 36 is associated with a single pair of rail-evaporators 30. Inlet ducts 74 are arranged in flow communication with a rail-evaporator 30, via vapor conduit 32 and inlet manifold 75, and outlet ducts 76 are arranged in flow communication with the other rail-evaporator 30, via liquid conduit 34 and outlet manifold 77. Front wall 70 and rear wall 72 include confronting surfaces that may include a variety of surface features (e.g., posts, mesh, grooves, irregularly shaped protrusions, baffles, and wick materials) that are adapted for aiding in the dispersal of thermal energy from the working fluid to front wall 70 and rear wall 72 as it passes between them. In one embodiment, cross-tubes 82 extend from inlet ducts 74, between front plate 70 and rear plate 72, and into outlet 76. In another embodiment, a serpentine shaped conduit 83 is positioned between front wall 70 and rear wall 72 (FIG. 11).

Condenser 36 acts as a heat exchanger transferring heat contained in a mixture of vaporous working fluid and liquid working fluid (not shown) to the ambient surroundings, via external heat sink 12. External heat sink 12 may comprise conventional heat exchangers having the capability to facilitate transfer of thermal it energy, and are often heat transfer devices, such as a fin stack, cold plate or secondary heat exchanger of the type well known in the art. In one embodiment of the invention condensers 36 are thermally engaged with a conventional fin stack and cold plate that are adapted to utilize air flow for the transfer of heat.

Figure 8:
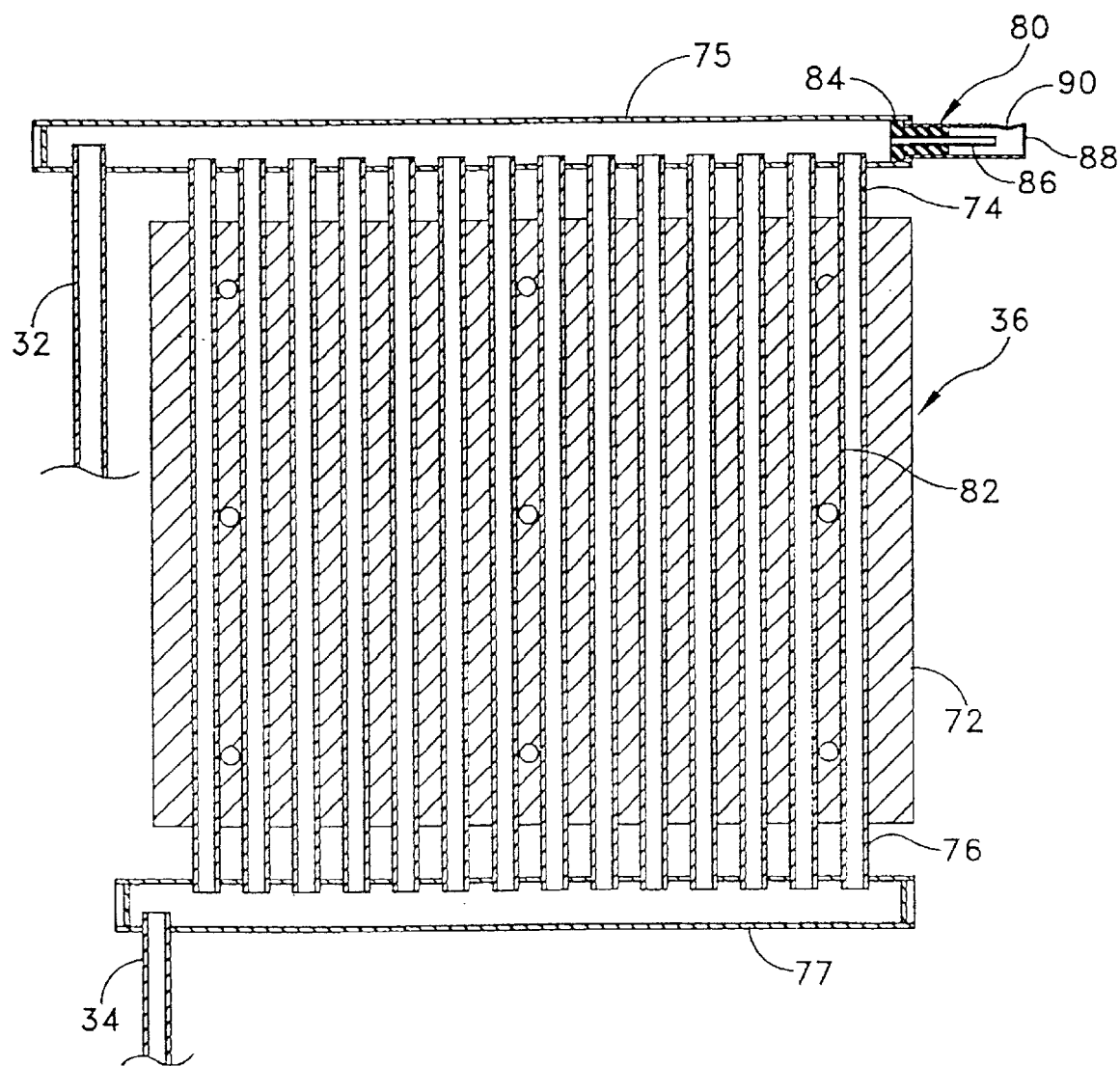
FIG. 8 is a cross-sectional view of a condenser formed in accordance with the present invention, as taken along line 8—8 in FIG. 4.
Figure 9:
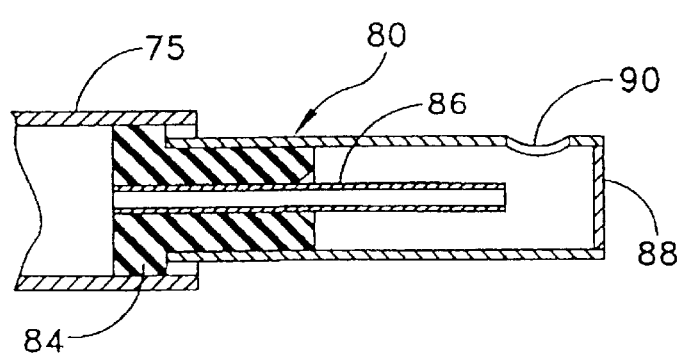
FIG. 9 is a cross-sectional view of an end cap assembly used in connection with the condenser, as viewed along line 9—9 in FIG. 4.
Figure 10:
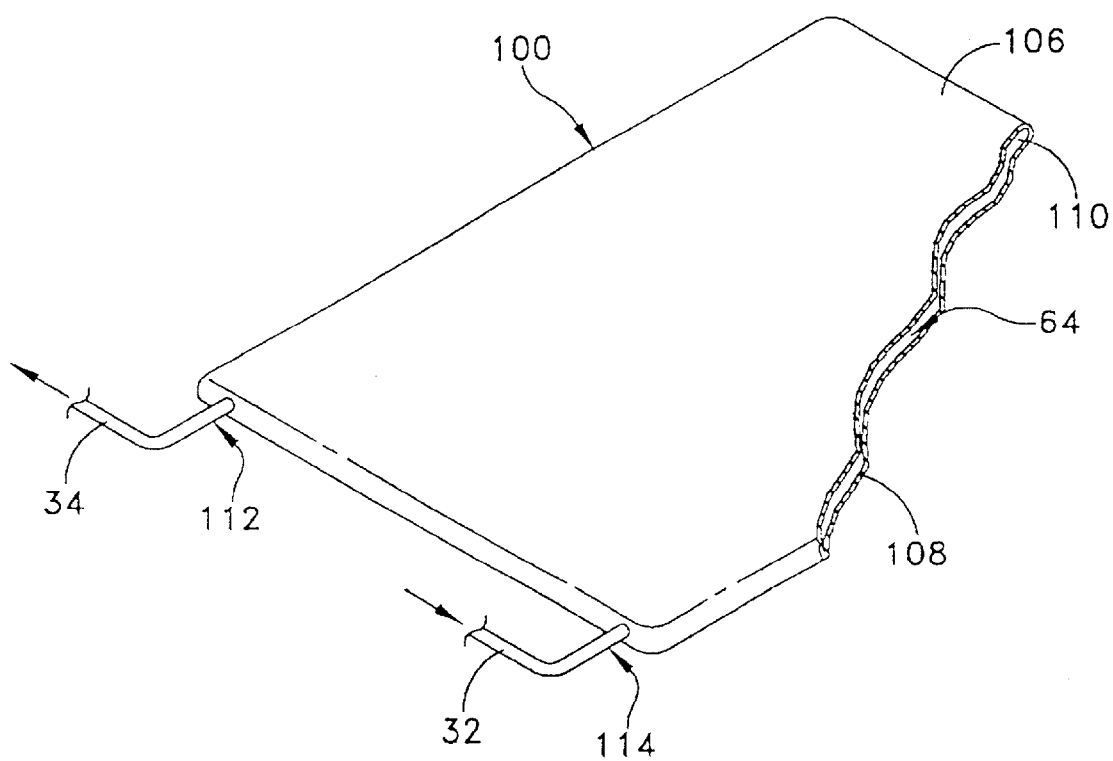
FIG. 10 is a partially broken-away, perspective view of another alternative embodiment of evaporator for use in connection with the present invention.

Still referring to FIGS. 8 and 9, end cap assembly 80 comprises a condenser end cap 84, a fill tube 86, and a fill tube protector 88. More particularly, condenser end cap 84 comprises a resilient material that is adapted to sealingly fill the end of an inner passageway of inlet manifold 75. Fill tube 86 extends through condenser end cap 84 and provides for flow communication with the inner portions of inlet manifold 75. Fill tube protector 88 is positioned in surrounding relation to condenser end cap 84 and fill tube 86, and includes an entrance opening 90 that is arranged adjacent to and open end of fill tube 86. In this way, thermal bus 5 may be partially evacuated, and then filled with the working fluid prior to sealing opening 90 in end cap protector 88.

Each thermal bus 5 operates in the following manner. As thermal energy is generated by components 7 on circuit boards 9, the working fluid disposed within horizontally oriented tubes 44 evaporates and moves toward port 53 and the entrance to vapor conduit 32. It should be understood that tubes 44 and inter-rail duct 31 function as a heat pipe to the extent that liquid is wicked by capillary wick 64 from cooler portions of tubes 44 to higher temperature portions, and therefore are unaffected by their horizontal orientation. Liquid is also moved by capillary action between tubes 44 as a result of capillary wick 64 being present within internal passageway 48 of inter-rail duct 31.

As the working fluid is vaporized, it moves between tubes 44 via inter-rail duct 31, until it enters vapor conduit 32 through port 53. Vapor conduit 32 has a relatively large diameter to accommodate vaporized working fluid at various vapor pressures. The vaporized working fluid moves through vapor conduit 32 and into inlet manifold 75 positioned above condenser 36. Once the vaporized working fluid enters inlet manifold 75 it travels through inlet ducts 74 into the interior of condenser 36 where the vaporized working fluid condenses on the relatively cooler interior surfaces of front and rear walls 70 and 72. Due to the vertical orientation of condensers 36, the condensed working fluid moves toward a bottom portion of condenser 36, via cross-tubes 82, and enters outlet manifold 77 via outlet ducts 76. Liquid conduit 34 is arranged in flow communication with the interior of outlet manifold 77 such that condensed, liquid working fluid enters liquid conduit 34 and travels, by force of gravity, back to port 54 so as to be reintroduced into tubes 44 of rail-evaporators 30.

The foregoing cyclic system continues to operate as described while thermal energy is being generated by components 7 on circuit boards 9. When the electronic system is inactive, liquid tends to pool within tubes 44 in rail-evaporators 30 so as to be available for further heat transfer at the time the system is activated.

Referring to FIGS. 10, and 12–15, two alternative embodiments of the present invention comprise the use of either a vapor chamber evaporator 100 or cold plate 105 in place of rail evaporators 30. More particularly, vapor chamber evaporator 100 comprises a top plate 106, a bottom plate 108, and internal chamber 110 having interior surfaces covered by capillary wick 64. Vapor chamber evaporator 100 operates as a heat pipe, inasmuch as internal chamber 110 is partially evacuated and filled with a working fluid. An entrance port 112 and exit port 114 interconnect liquid conduit 34 and vapor conduit 32 with the ends of a serpentine conduit 118 that is embedded within vapor chamber evaporator 100 (FIGS. 10 and 12–15). This embodiment of the invention operates in the same manner as previously described.

Figure 16:
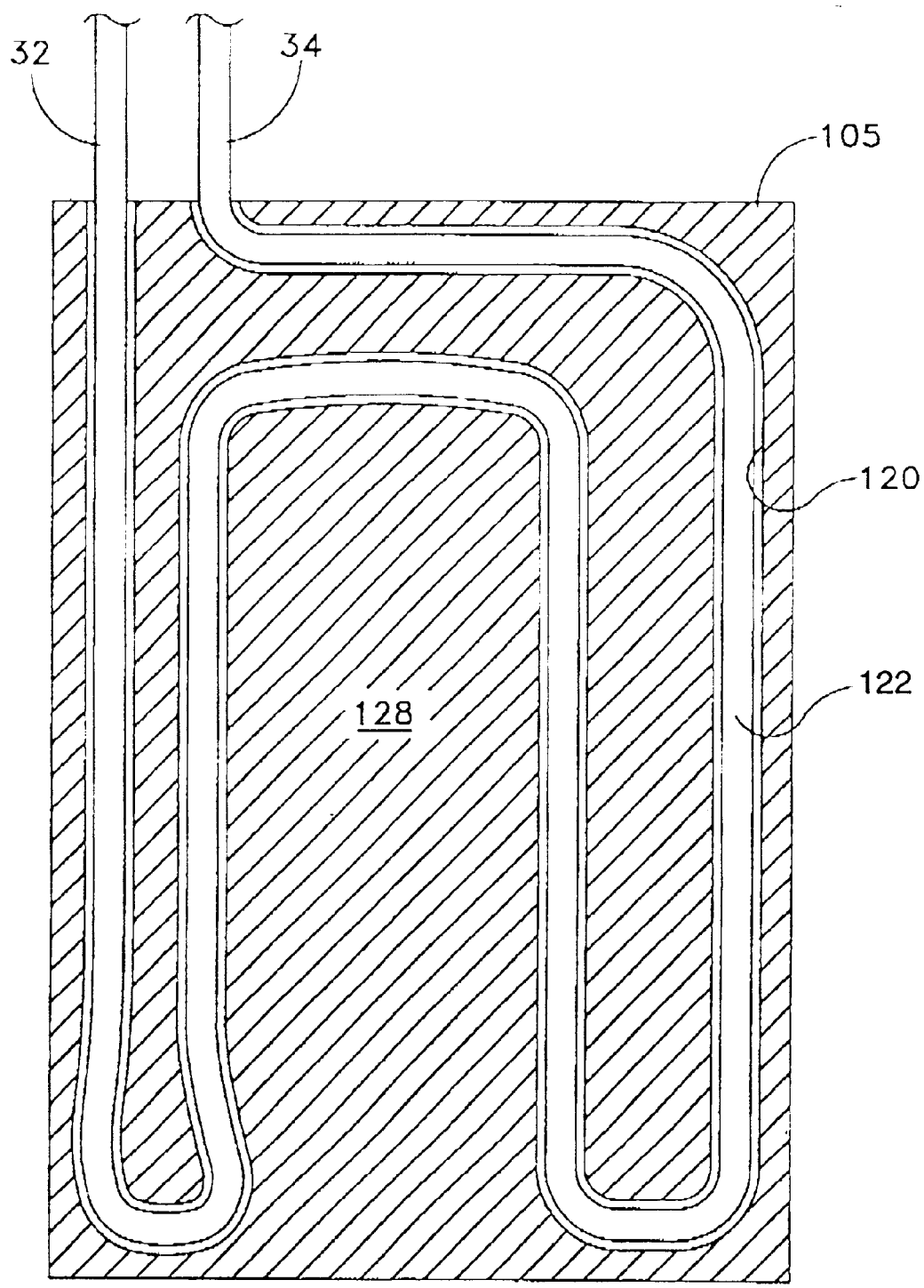
FIG. 16 is a side elevational view of an alternative evaporator formed in accordance with the present invention.

A cold plate 105 may be substituted for vapor chamber evaporator 100 (FIG. 16). Cold plate 105 is formed from a flat sheet of thermally conductive material, such as copper, aluminum, steel, or the like. Each cold plate 105 includes a channel 120. Channel 120 may have a rectilinear cross-section, but other cross-sectional shapes, i.e., oval, round, polygonal may also be used with good effect, with each cutting path through surface 128 of cold plate 105. Of course, various other shapes and arrangements may be employed, e.g., zig-zag, stepped, spiral, etc., depending upon the pattern of components 7 on circuit board 9. A conduit 122 is positioned within channel 120, and is interconnected in flow communication with vapor conduit 32 and liquid conduit 34. This embodiment of the invention operates in a similar manner as previously described.

Figure 17:
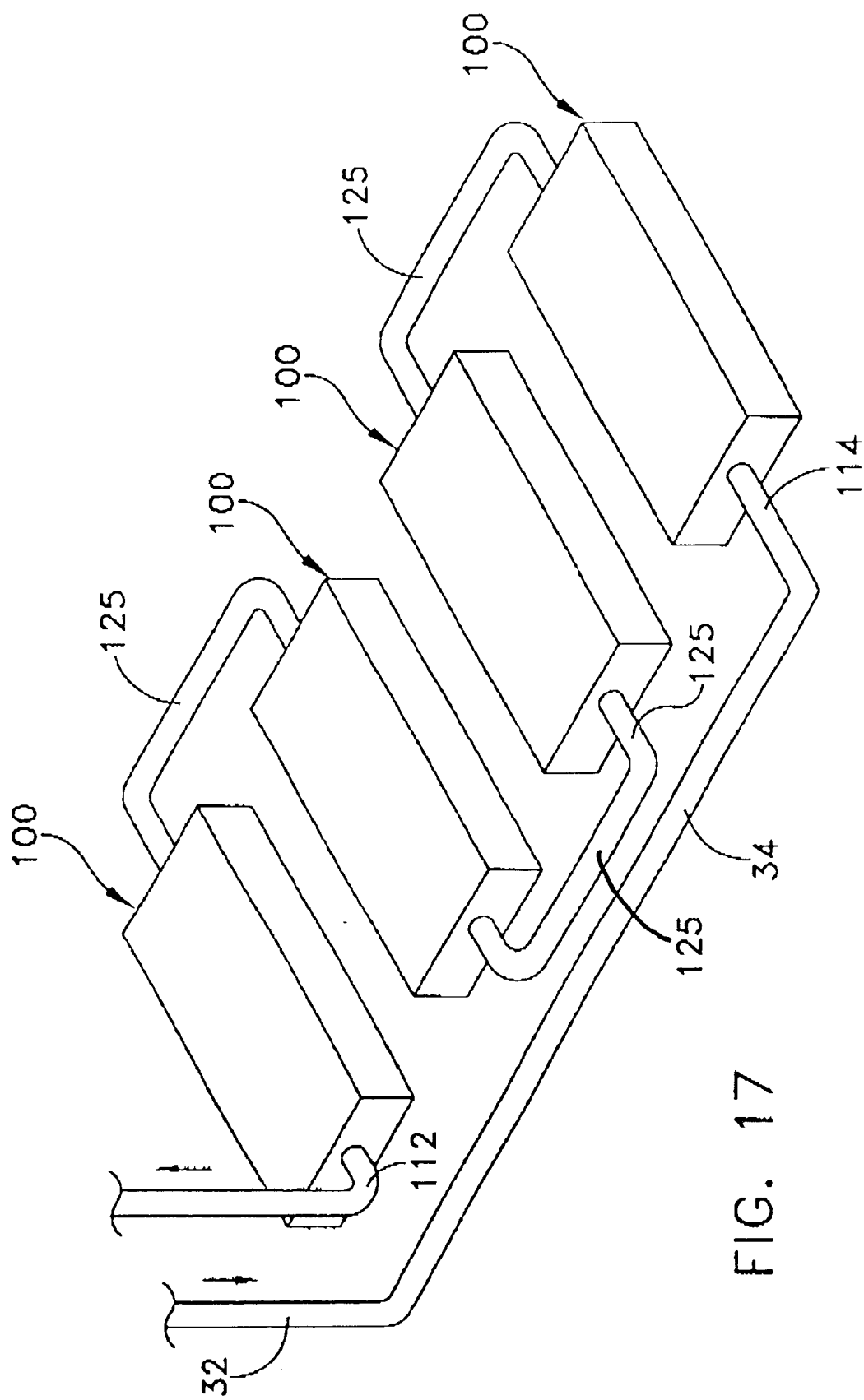
FIG. 17 is a perspective view of another embodiment of the invention comprising a plurality of vapor chamber type evaporators arranged in serial flow communication.
Figure 18:
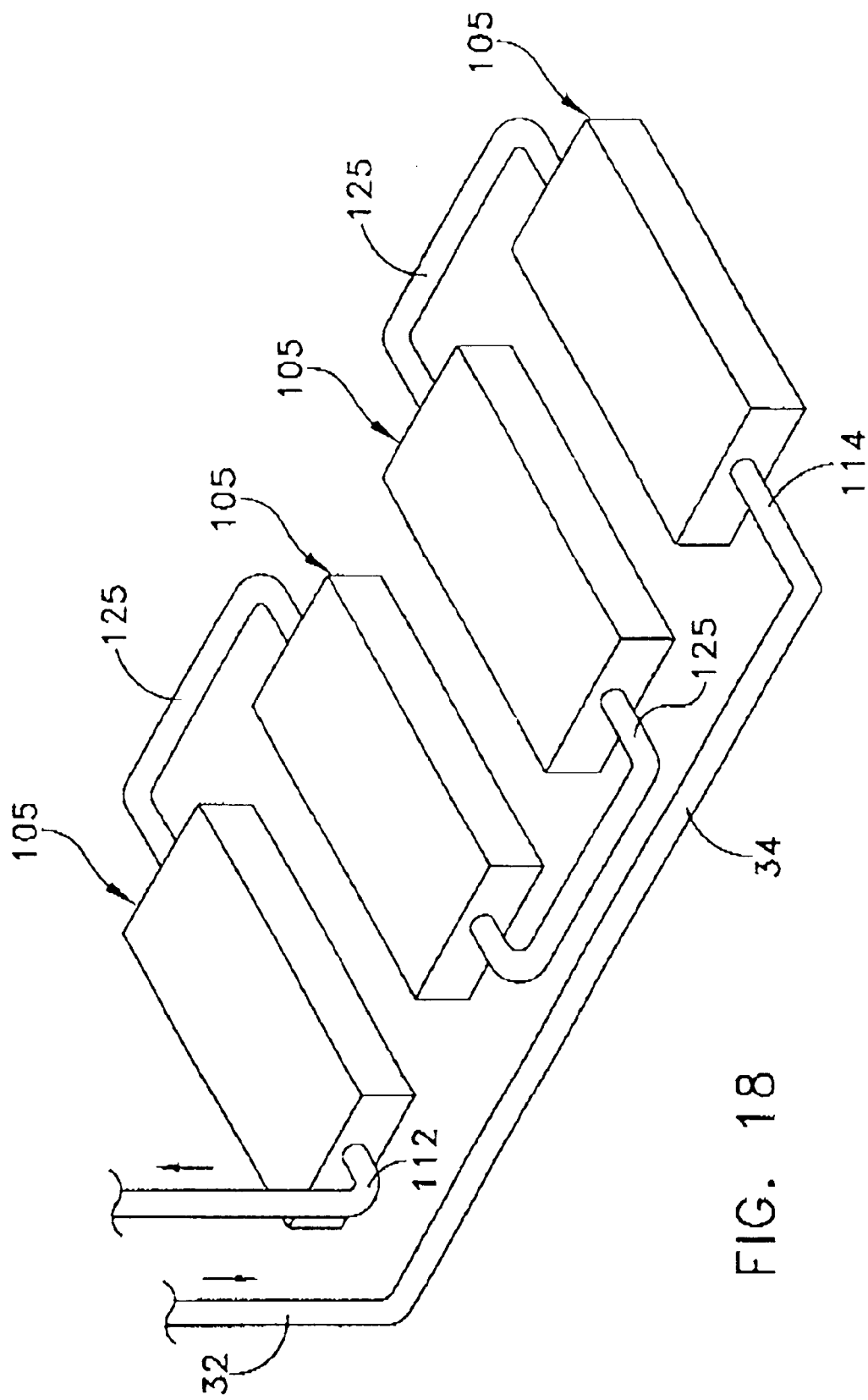
FIG. 18 is a perspective view of yet another embodiment of the invention comprising a plurality of cold plate type evaporators arranged in serial flow communication.
Figure 19:
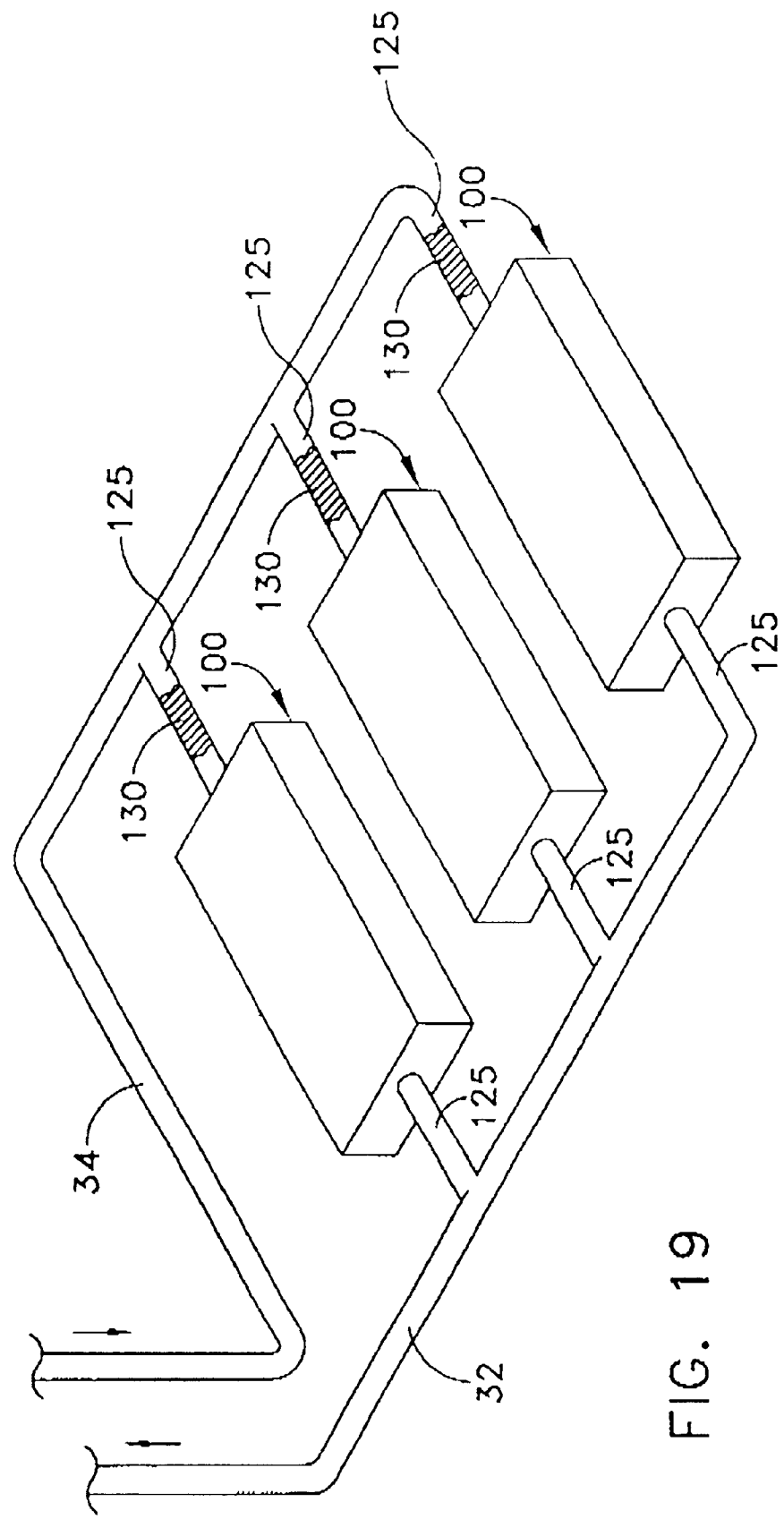
FIG. 19 is a perspective view of yet another embodiment of the invention comprising a plurality of vapor chamber type evaporators arranged in parallel flow communication.

Additionally, the horizontal evaporators of the present invention may be formed from several individual vapor chamber evaporators 100 or cold plates 105 as required to solve a particular design need. As shown in FIGS. 17–19, a plurality of substantially horizontally oriented evaporators 100 or 105 may be arranged in serial flow communication to one another or in parallel flow communication to one another by means of interconnecting conduits 125. In some instances a hydraulic resistance 130 (e.g., porous slugs or orifices inside the liquid return lines) may be inserted in liquid conduit 125 in order to regulate liquid flow into vapor chamber evaporators 100 or cold plates 105 by more evenly returning liquid working fluid between the parallel vapor chambers. Hydraulic resistances 130 may be tuned for the varying heat load on different vapor chambers.

It is to be understood that the present invention is by no means limited only to the particular constructions herein disclosed and shown in the drawings, but also comprises any modifications or equivalents within the scope of the claims.

What is claimed is:

1. A thermal bus for cabinets housing high power electronics equipment comprising:

two spaced-apart parallel evaporators each horizontally mounted in a support having a central recess and each having a tube having a capillary wick disposed on an internal surface and being mounted within said central recess of said support, wherein each of said tubes comprises a closed distal end and a closed proximal end and including a liquid-working fluid entrance port located at said closed proximal end of said first tube and a vaporous-working fluid exit port located at said closed proximal end of said second tube;

a duct defining a central passageway having a capillary wick disposed on the walls of said central passageway, wherein said duct is disposed in fluid communication with said first tube and said second tube; and a condenser having a vaporous-working fluid entrance port disposed in flow communication with said vaporous-working fluid exit port and a liquid-working fluid exit port disposed in flow communication with said liquid-working fluid entrance port so that a working fluid cycles; (i) through said two spaced-apart parallel evaporators, and (ii) between said condenser and said two tubes.

2. A thermal bus according to claim 2 wherein each of said tubes comprises an exposed thermal interface surface positioned in abutting thermal communication with said at least one heat generating device.

3. A thermal bus according to claim 2 wherein each of said tubes comprises a side bore located adjacent to said closed distal end and arranged in coaxial-aligned relation said duct.

4. A thermal bus according to claim 2 wherein each of said tubes comprises a rectilinear cross-section.

5. A thermal bus for cabinets housing high power electronics equipment comprising:

at least two substantially horizontally oriented evaporators mounted in a support and positioned in thermal communication with at least one heat generating device, wherein said at least two substantially horizontally oriented evaporators each define a first central passageway having a liquid-working fluid entrance port and a vaporous-working fluid exit port and a capillary wick disposed on the walls of said first central passageway;

a plurality of ducts each defining a second central passageway having a capillary wick disposed on the walls of said second central passageway, wherein said plurality of ducts are disposed in fluid communication between said first central passageways of said at least two substantially horizontally oriented evaporators; and a condenser having a serpentine tube positioned therewithin and having a vaporous working fluid entrance port disposed in flow communication with said vaporous working fluid exit port and a liquid working fluid exit port disposed in flow communication with said liquid working fluid entrance port so that a working fluid cycles; (i) through said substantially horizontally oriented evaporator, and (ii) between said condenser and said substantially horizontally oriented evaporator.

6. A thermal bus for cabinets housing high power electronics equipment comprising:

two spaced-apart horizontally oriented evaporators each mounted in a support and positioned in thermal communication with at least one heat generating device, wherein each of said two spaced-apart evaporators defines a first central passageway having a liquid-working fluid entrance port and a vaporous working fluid exit port and a capillary wick disposed on the walls of said first central passageway;

a duct defining a second central passageway having a capillary wick disposed on the walls of said second central passageway, wherein said duct is disposed in fluid communication with said first central passageways of said two spaced-apart horizontally oriented evaporators; and a condenser having a vaporous-working fluid entrance port disposed in flow communication with said vaporous-working fluid exit port and a liquid-working fluid exit port disposed in flow communication with said liquid-working fluid entrance port so that a working fluid cycles; (i) through said two spaced-apart horizontally oriented evaporators, and (ii) between said condenser and said two spaced-apart horizontally oriented evaporators.

7. A thermal bus according to claim 6 wherein said two spaced-apart horizontally oriented evaporators are arranged in substantially parallel relation to one another.

8. A thermal bus according to claim 6 wherein each of said supports comprises a central recess with a tube defining said first central passageway mounted within said central recess.

9. A thermal bus according to claim 8 wherein each recess is open ended, and includes a first opening that is sized to receive an end of said duct.

10. A thermal bus according to claim 8 comprising a first tube and a second tube wherein each of said tubes comprises a closed distal end and a closed proximal end and wherein said liquid-working fluid entrance port is located at said closed proximal end of said first tube and said vaporous-working fluid exit port is located at said closed proximal end of said second tube.

11. A thermal bus according to claim 10 wherein each of said tubes comprises an exposed thermal interface surface positioned in abutting thermal communication with said at least one heat generating device.

12. A thermal bus according to claim 10 wherein each of said tubes comprises a side bore located adjacent to said closed distal end and arranged in coaxial-aligned relation to said duct.

13. A thermal bus according to claim 10 wherein each of said tubes comprises a rectilinear cross-section.

14. A thermal bus according to claim 6 wherein said condenser comprises a front wall and a rear wall arranged in confronting relation to one another and including a plurality of inlets ducts extending from an inlet manifold positioned above said condenser and a plurality of outlet ducts extending into an outlet manifold positioned below said condenser.

15. A thermal bus according to claim 14 wherein said vaporous-working fluid entrance port is located in said inlet manifold and said liquid-working fluid exit port is located in said outlet manifold.

16. A thermal bus according to claim 14 wherein a vapor conduit extends between said condenser and one of said two spaced-apart horizontally oriented evaporators and a liquid conduit extends between said condenser and one of said two spaced-apart horizontally oriented evaporators.

17. A thermal bus according to claim 16 wherein said vapor conduit has a larger diameter than said liquid conduit.

18. A thermal bus according to claim 16 wherein said vapor conduit is in flow communication with said vaporous-working fluid exit port and said vaporous-working fluid entrance port and said liquid conduit is in flow communication with said liquid-working fluid entrance port and said liquid-working fluid exit port.

19. A thermal bus according to claim 14 wherein said front wall and said rear wall include confronting surfaces that are adapted for aiding in the dispersal of thermal energy from a working fluid.

20. A thermal bus according to claim 14 comprising an end cap assembly having a condenser end cap lodged within a portion of said inlet manifold, a fill tube projecting from said end cap, and a fill tube protector disposed in surrounding relation to said end cap and said fill tube.

21. A thermal bus for cabinets housing high power electronics equipment comprising:
    two spaced-apart evaporators each mounted in a support having a central recess and each having a tube having a capillary wick disposed on an internal surface and being mounted within said central recess of said support, wherein one of said tubes includes a liquid-working fluid entrance port and one of said tubes includes a vaporous-working fluid exit port and wherein said tubes are positioned in thermal-communication with at least one heat generating device;
    a duct defining a central passageway having a capillary wick disposed on the walls of said central passageway, wherein said duct is disposed in fluid communication with said tubes; and
    a condenser having a vaporous-working fluid entrance port disposed in flow communication with said vaporous-working fluid exit port and a liquid-working fluid exit port disposed in flow communication with said liquid-working fluid entrance port so that a working fluid cycles; (i) through said two spaced-apart evaporators, and (ii) between said condenser and said two tubes.

22. A system for controlling the heat generated within a cabinet housing high power electronics equipment comprising, in combination:
    a plurality of horizontally oriented circuit boards having heat generating devices disposed on at least on surface;
    a plurality of thermal buses each comprising:
        two spaced-apart, parallel evaporators each mounted in a support and positioned in thermal communication with at least one of said.,plurality of circuit boards, wherein each of said two spaced-apart, parallel evaporators defines a central passageway having a liquid-working fluid entrance port and a vaporous-working fluid exit port and a capillary wick disposed on the walls of the central passageway;
        a duct defining a central passageway having a capillary wick disposed on the walls of said central passageway, wherein said duct disposed in fluid communication with said central passageways of said two spaced-apart, parallel evaporators; and
        a condenser having a vaporous-working fluid entrance port disposed in flow communication with said vaporous-working fluid exit port and a liquid-working fluid exit port disposed in flow communication with said liquid-working fluid entrance port so that a working fluid cycles; (i) through said two spaced-apart evaporators, and (ii) between said condenser and said two spaced-apart evaporators; and
    a rack positioned within said cabinet and supporting said plurality of thermal busses and circuit boards.

23. A thermal bus for cabinets housing high power electronics equipment comprising:
    a horizontal evaporator mounted in a support and having a chamber with a capillary wick disposed on an internal surface and including a liquid-working fluid entrance port and a vaporous-working fluid exit port and wherein said horizontal evaporator is positioned in thermal communication with at least one heat generating device; and
    a condenser having a vaporous-working fluid entrance port disposed in flow communication with said vaporous-working fluid, exit port and a liquid-working fluid exit port disposed in flow communication with said liquid-working fluid entrance port so that a working fluid cycles between said condenser and said horizontal evaporator.

24. A thermal bus for cabinets housing high power electronics equipment comprising a loop thermosyphon comprising:
    a substantially horizontally oriented evaporator mounted in a support and positioned in thermal communication with at least one heat generating device, wherein said substantially horizontally oriented evaporator defines a central passageway having a liquid working fluid entrance port and a vaporous working fluid exit port and a capillary wick disposed on the walls of said first central passageway; and
    a condenser having a vaporous working fluid entrance port disposed in flow communication with said vaporous working fluid exit port and a liquid-working fluid exit port disposed in flow communication with said liquid working fluid entrance port so that a working fluid cycles; (i) through said substantially horizontally oriented evaporator, and (ii) between said condenser and said substantially horizontally oriented evaporator.

25. A thermal bus according to claim 24 comprising a plurality of substantially horizontally oriented evaporators arranged in substantially parallel relation to one another.

26. A thermal bus according to claim 25 comprising a plurality of evaporators that are tilted by about ten degrees relative to horizontal.

27. A thermal bus according to claim 25 comprising a plurality of evaporators that are horizontally tilted by about ten degrees and arranged in substantially parallel relation to one another.

28. A thermal bus according to claim 24 wherein said substantially horizontally oriented evaporators include a vapor chamber.

29. A thermal bus according to claim 24 wherein said substantially horizontally oriented evaporators include a cold plate having a serpentine tube embedded therein and in flow communication with said condenser.

30. A thermal bus according to claim 24 wherein said substantially horizontally oriented evaporators include a vapor chamber having a serpentine tube embedded therein and in flow communication with said condenser.

31. A thermal bus according to claim 24 wherein said substantially horizontally oriented evaporators include a vapor chamber having at least a portion of a serpentine tube positioned within said vapor chamber and in flow communication with said condenser.

32. A thermal bus according to claim 24 wherein said substantially horizontally oriented evaporators include a vapor chamber having at least a portion of a serpentine tube positioned on said vapor chamber and in flow communication with said condenser.

33. A thermal bus according to claim 24 wherein said condenser includes a serpentine tube embedded therein and in flow communication with said substantially horizontally oriented evaporator.

34. A thermal bus according to claim 24 comprising a plurality of substantially horizontally oriented evaporators arranged in serial flow communication to one another.

35. A thermal bus according to claim 24 comprising a plurality of substantially horizontally oriented evaporators arranged in parallel flow communication to one another.

36. A thermal bus according to claim 24 comprising a plurality of substantially horizontally oriented evaporators arranged in parallel flow communication to one another by interconnecting conduits wherein at least one of said conduits comprises a hydraulic resistance.

* * * * *

UNITED STATES PATENT AND TRADEMARK OFFICE
CERTIFICATE OF CORRECTION

PATENT NO.   : 6,536,510 B2
DATED        : March 25, 2003
INVENTOR(S)  : Dmitry Khrustalev et al.

It is certified that error appears in the above-identified patent and that said Letters Patent is hereby corrected as shown below:

Column 9,
Line 44, change "2" to -- 1 --

Signed and Sealed this

Fifth Day of August, 2003

JAMES E. ROGAN
*Director of the United States Patent and Trademark Office*